United States Patent
Fazzio

(10) Patent No.: US 6,822,176 B1
(45) Date of Patent: Nov. 23, 2004

(54) LIQUID METAL SWITCH AND METHOD OF MANUFACTURE THEREFOR

(75) Inventor: Ronald Shane Fazzio, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/826,248

(22) Filed: Apr. 16, 2004

(51) Int. Cl.[7] .............................................. H01H 29/00
(52) U.S. Cl. ...................................................... 200/182
(58) Field of Search ............................. 200/182, 183, 200/187, 188, 191, 192, 214, 216

(56) References Cited

U.S. PATENT DOCUMENTS

| | | | |
|---|---|---|---|
| 6,323,447 B1 * | 11/2001 | Kondoh et al. | ............. 200/182 |
| 6,558,969 B2 | 5/2003 | Miller et al. | |
| 6,559,420 B1 * | 5/2003 | Zarev | ........................... 219/209 |
| 6,689,976 B1 * | 2/2004 | Dove et al. | .................. 200/182 |
| 6,743,991 B1 * | 6/2004 | Wong et al. | ................. 200/182 |
| 6,765,162 B2 * | 7/2004 | Wong et al. | ................. 200/182 |

* cited by examiner

Primary Examiner—Michael A. Friedhofer

(57) ABSTRACT

A switch device and method for manufacturing the switch device in which substrates are provided collectively having defined therein a liquid metal switch and a sub-channel connected to the liquid metal switch. A cavity filled with sacrificial material is formed in a first one of the substrates. A heater element is formed at least in part over the sacrificial material and conductive vias are formed extending through one of the substrates to the heater element. The sacrificial material is removed and the substrates are joined with an adhesive seal.

20 Claims, 6 Drawing Sheets

LIQUID METAL SWITCH AND METHOD OF MANUFACTURE THEREFOR

BACKGROUND

There are many different types of electrical micro-relay devices, and one popular type is the reed micro-relay, which is a small, mechanical contact type of electrical micro-relay device. A reed micro-relay has two reeds made of a magnetic alloy sealed in an inert gas inside a glass vessel surrounded by an electromagnetic driver coil. When current is not flowing in the coil, the tips of the reeds are biased to break contact and the device is switched off. When current is flowing in the coil, the tips of the reeds attract each other to make contact and the device is switched on.

The reed micro-relay has problems related to its large size and relatively short service life. As to the first problem, the reeds not only require a relatively large space, but also do not perform well during high frequency switching due to their size and electromagnetic response. As to the second problem, the flexing of the reeds due to biasing and attraction causes mechanical fatigue, which can lead to breakage of the reeds after extended use.

In the past, the reeds were tipped with contacts composed of rhodium (Rh) or tungsten (W), or were plated with rhodium (Rh) or gold (Au) for conductivity and electrical arcing resistance when making and breaking contact between the reeds. However, these contacts would fail over time. This problem with the contacts has been improved with one type of reed micro-relay called a "wet" relay. In a wet relay, a liquid metal such as mercury (Hg) is used to make the contact. This solved the problem of contact failure, but the problem of mechanical fatigue of the reeds remained unsolved.

In an effort to solve these problems, electrical micro-relay devices have been proposed that make use of the liquid metal in a channel between two micro-relay electrodes without the use of reeds. In the liquid metal devices, the liquid metal acts as the contact connecting the two micro-relay electrodes when the device is switched ON. The liquid metal is separated between the two micro-relay electrodes by a fluid non-conductor when the device is switched OFF. The fluid non-conductor is generally high-purity nitrogen or some other such inert gas.

With regard to the size problem, the liquid metal devices afford a reduction in the size of an electrical micro-relay device since reeds are not required. Also, the use of the liquid metal affords longer service life and higher reliability.

The liquid metal devices are generally manufactured by joining together two substrates with a heater in between to heat the gas. The gas expands to separate the liquid metal to open and close a circuit. Previously, the heaters were inline resistors patterned directly on the surface of one of the substrates. The substrates were of materials such as glass, quartz, and gallium arsenide upon which the heater layer was deposited and etched. Since only isotropic etching could be used, the heater element would consist of surface wiring. The major drawback of surface wiring would be loss of heat due to thermal transfer into the underlying substrate.

More recently, suspended heaters have been developed. A suspended heater refers to a configuration in which the heating elements are positioned with a portion directly supported by the silicon substrate and the remaining portion supported over an opening so that the remaining portion can be completely surrounded by the gas.

Problems with previous suspended heaters included the difficulty of handling the power required for heating at smaller sizes.

Further, where heating elements have portions directly supported by silicon substrates, there is a relatively large amount of thermal loss, which must be offset by higher power being applied to the heating elements. This in turn can result in lower reliability.

Solutions to these problems have been long sought, but prior developments have not taught or suggested any solutions and, thus, solutions to these problems have long eluded those skilled in the art.

SUMMARY OF THE INVENTION

The present invention provides a switch device and method for manufacturing the switch device in which substrates are provided collectively having defined therein a liquid metal switch and a sub-channel connected to the liquid metal switch. A cavity filled with sacrificial material is formed in a first one of the substrates. A heater element is formed at least in part over the sacrificial material and conductive vias are formed extending through one of the substrates to the heater element. The sacrificial material is removed and the substrates are joined with an adhesive seal.

Certain embodiments of the invention have other advantages in addition to or in place of those mentioned above. The advantages will become apparent from a reading of the following detailed description when taken with reference to the accompanying drawings.

DETAILED DESCRIPTION OF THE INVENTION

Figure 1:
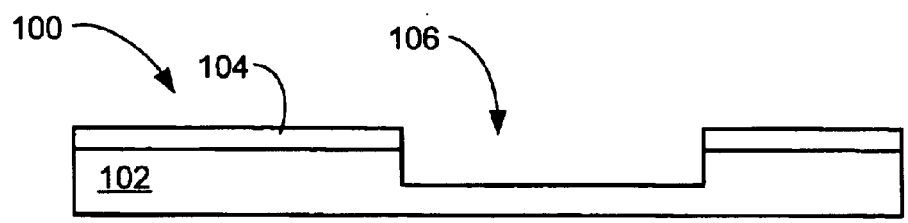
FIG. 1 is a view of a liquid metal switch device in an intermediate stage of manufacture in accordance with one embodiment of the present invention.

Referring now to FIG. 1, therein is shown a liquid metal switch device 100 in an intermediate stage of manufacture in accordance with one embodiment of the present invention. A first substrate 102 is provided with a heater cavity etch mask 104 thereon, which is used to form a heater cavity 106 therein. The first substrate 102 may be a silicon wafer in which a large number of heater cavities, such as the heater cavity 106, are formed to allow making a large number of liquid metal switch devices at one time using semiconductor-type processing and multiple wafers.

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. In addition, the drawings showing embodiments of the apparatus are semi-diagrammatic and not to scale and, particularly, some of the dimensions are for the clarity of presentation and may be exaggerated in the drawing FIGs. The same numbers will be used in all the drawing FIGs. to relate to the same elements.

The term "horizontal" as used herein is defined as a plane parallel to a substrate or wafer. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane. The term "processing" as used herein includes deposition of material or photoresist, patterning, exposure, development, etching, cleaning, and/or removal of the material or photoresist as required in forming a described structure. The term "forming" as used herein includes processes such as depositing, growing, building, chemically combining, or other processes for forming layers, films, and structures.

Figure 2:
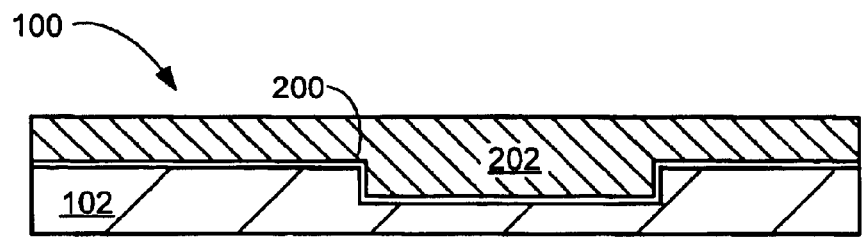
FIG. 2 is the structure of FIG. 1 after growing a barrier layer on the surface of a substrate and in a heater cavity, and deposition of a sacrificial material.

Referring now to FIG. 2, therein is shown the structure of FIG. 1 after depositing an optional barrier layer 200 on the surface of the first substrate 102 and the heater cavity 106 and after deposition of a sacrificial layer 202 on the optional barrier layer 200. The first substrate 102 may be of silicon (Si), and the barrier layer 200 may be of silicon oxide ($SiO_2$), other oxides or nitrides, e.g., silicon nitride could be used. Also, other materials may be used, and in fact, may enhance the performance, e.g. gold (provided there is additionally a sealing layer to prevent gold-mercury interaction), platinum (which will need a seed layer, such as chrome or nickel chromium), chrome, silver, nickel, or titanium.

The sacrificial layer 202 can be any material that can be removed by an etching process that does not negatively affect the heater and other elements after construction. Two examples would be PSG (phospho-silicate glass) or aluminum, if a hydrofluoric acid wet etch is acceptable.

Figure 3:
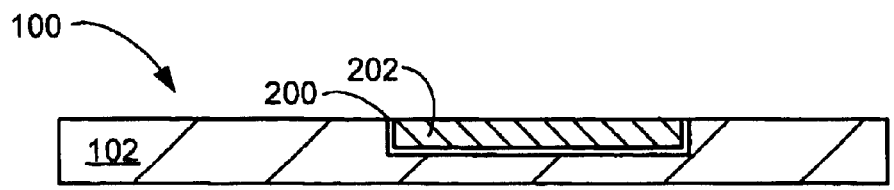
FIG. 3 is the structure of FIG. 2 after planarization.

Referring now to FIG. 3, therein is shown the structure of FIG. 2 after planarization of the sacrificial layer 202 by a process such as chemical-mechanical polishing (CMP). The planarization removes the sacrificial layer 202 and the barrier layer 200 overlying the surface of the first substrate 102 so that the surface of the first substrate 102 is coplanar with the edge of the barrier layer 200 and the top surface of the sacrificial layer 202.

Figure 4:
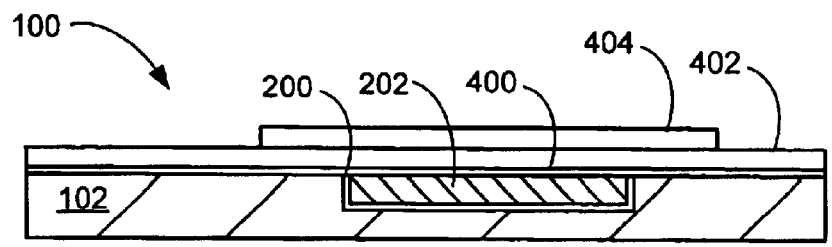
FIG. 4 is the structure of FIG. 3 after deposition of a seed layer and a heater layer, and processing a photoresist.

Referring now to FIG. 4, therein is shown the structure of FIG. 3 after deposition of a seed layer 400 and a heater layer 402, and processing of a photoresist layer to form a heater etch mask 404.

Seed materials need to provide adhesion for the heater layer 402 to the first substrate 102 and the proper amount of electrical conductivity between the heater layer 402 and its contacts. The seed layer 400 could be a material, such as silicon nitride ($Si_3N_4$), titanium nitride (TiN), aluminum nitride (AlN), chrome (Cr), or nickel chrome (NiCr). A material like aluminum nitride has a large bandgap and is therefore not the best conductor, so using it as a seed material may result in too high a contact resistance, in which case a metal may be more appropriate (provided it is compatible with the rest of the process, e.g., aluminum would not work if hydrofluoric acid is used for the heater release). On the other hand, if the seed layer is thin enough, use of a larger bandgap material may be acceptable.

The heater layer 402 could be a refractory nitride, tungsten silicon nitride ($WSi_3N_4$), tantalum nitride (TaN), or platinum (Pt). The same considerations of resistivity as for the seed layer 400 also apply to the heater material: the material must have a sufficiently high resistivity for rapid heating while having a sufficiently high conductivity for low power consumption and good reliability.

Figure 5:
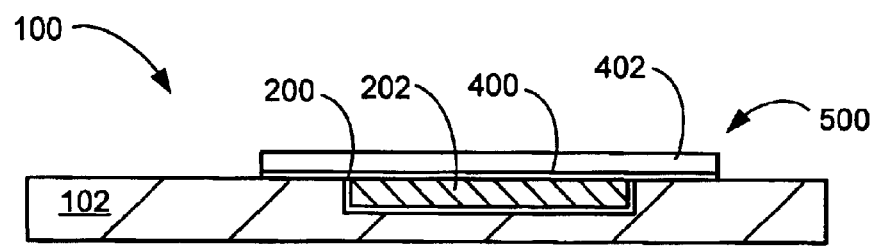
FIG. 5 is the structure of FIG. 4 after processing to form a heater element.
Figure 13:
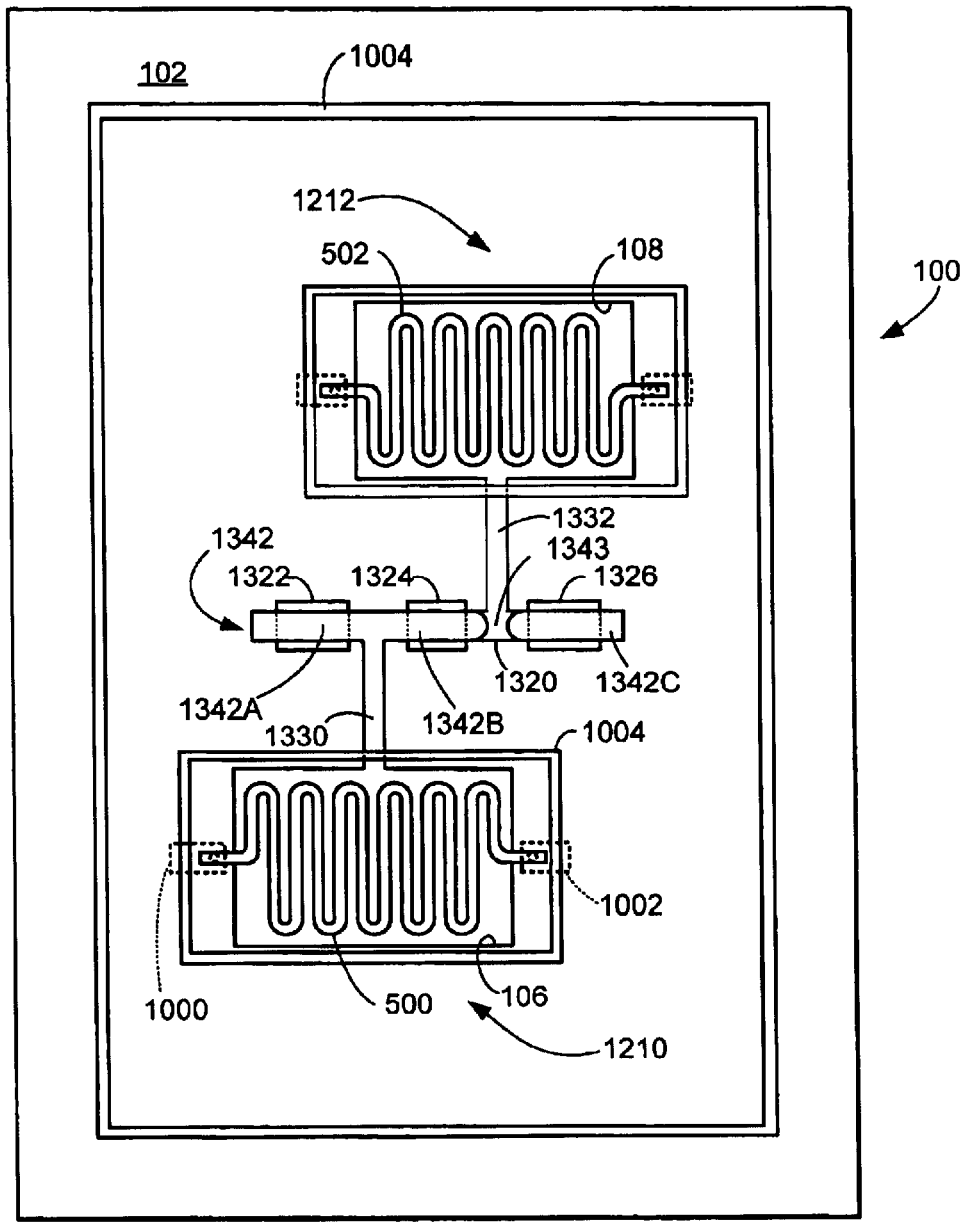
FIG. 13 is a simplified plan view of the liquid metal switch of FIG. 10 according to an embodiment of the present invention.

Referring now to FIG. 5, therein is shown the structure of FIG. 4 after processing to form a heater element 500 consisting of the heater layer 402 and the seed layer 400 and removal of the heater etch mask 404. The heater element 500 can be formed by a process such as etching to a number of different shapes such as mesh shapes, honeycomb shapes, membrane shapes that have no pattern, or any other shapes that will allow the passage of a fluid non-conductor through them. In one embodiment, a serpentine shape is used as shown in FIG. 13.

Figure 6:
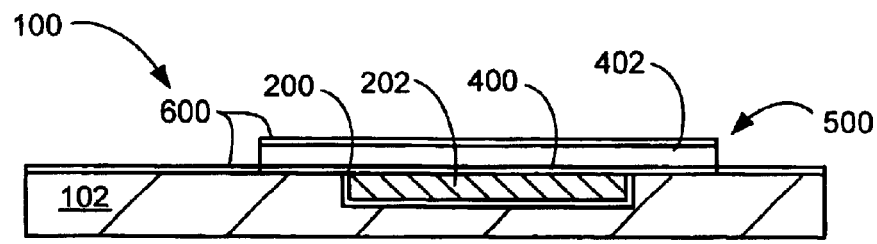
FIG. 6 is the structure of FIG. 5 after deposition of a passivation layer.

Referring now to FIG. 6, therein is shown the structure of FIG. 5 after deposition of an optional passivation layer 600 over the exposed surface of the first substrate 102 and the heater element 500. The passivation layer 600 can be of such a material as titanium nitride (TiN), aluminum nitride (AlN), silicon nitride ($Si_3N_4$), silicon dioxide ($SiO_2$), or platinum (Pt) where the material of the heater layer 402 requires passivation.

Figure 7:
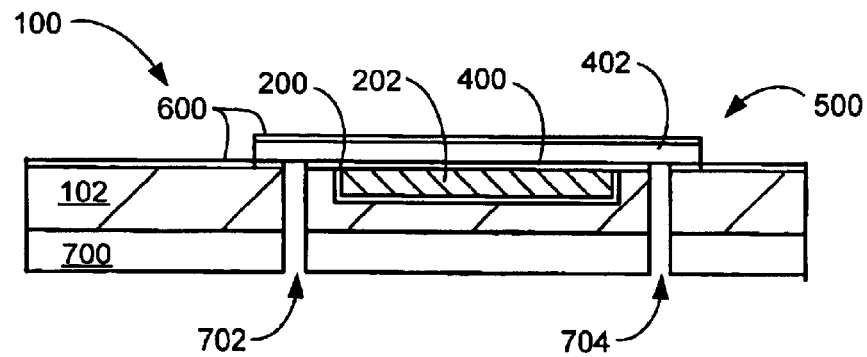
FIG. 7 is the structure of FIG. 6 after planarization of the bottom surface of the substrate, and deposition and processing of a bottom-side mask.

Referring now to FIG. 7, therein is shown the structure of FIG. 6 after planarization of the bottom surface of the first substrate 102, and deposition and processing of a bottom-side mask 700. A process such as bottom grinding planarizes the bottom surface of the first substrate 102. Then, the bottom-side mask 700 is deposited and processing is performed to form openings used to provide vias 702 and 704. The vias 702 and 704 are formed by a process such as etching through the first substrate 102 to the heater layer 402.

Figure 8:
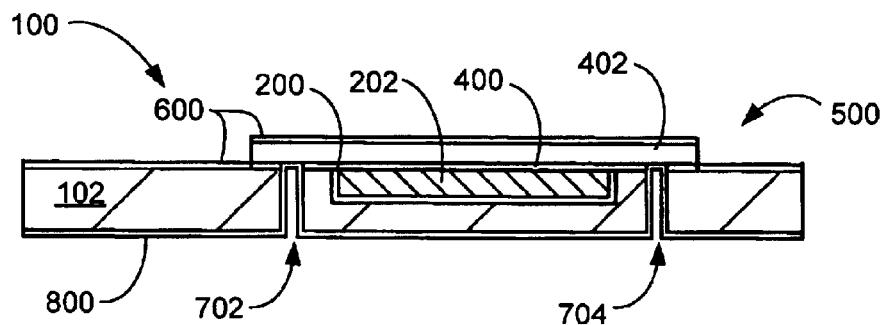
FIG. 8 is the structure of FIG. 7 after deposition of a via seed layer.

Referring now to FIG. 8, therein is shown the structure of FIG. 7 after deposition of a via seed layer 800. The bottom-side mask 700 of FIG. 7 has been removed and the via seed layer 800 has been deposited on the bottom of the first substrate 102 and in the vias 702 and 704. The via seed layer 800 may be material such as copper (Cu) or gold (Au).

Figure 9:
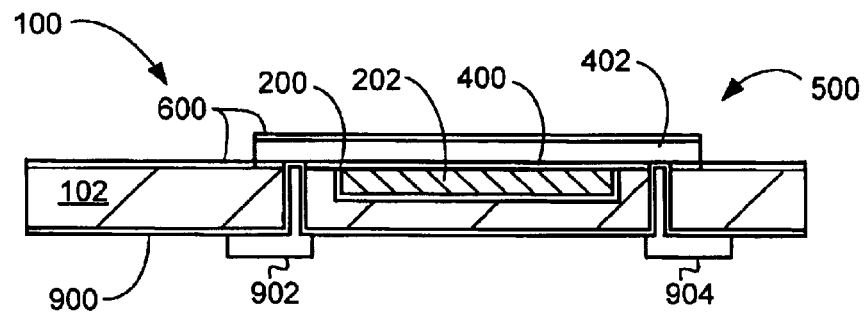
FIG. 9 is the structure of FIG. 8 after via masking and metalization.

Referring now to FIG. 9, therein is shown the structure of FIG. 8 after via metalization to thicken the via seed layer 800 of FIG. 8 and produce a via metalization 900. After via metalization plating, a via metalization etch mask is deposited and processed to form via masks 902 and 904.

Figure 10:
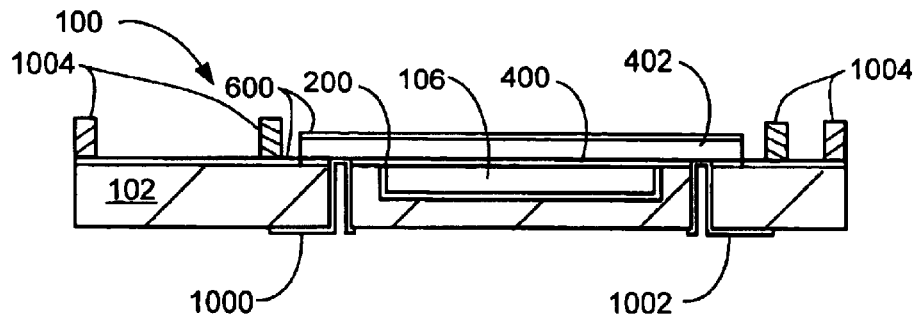
FIG. 10 is the structure of FIG. 9 after processing of the via metalization.

Referring now to FIG. 10, therein is shown the structure of FIG. 9 after processing of the via metalization 900 to form the pad/vias 1000 and 1002 and removal of the via masks 902 and 904. The pad/vias 1000 and 1002 provide the electrical connections to the heater layer 402.

Additionally, an adhesive sealing material has been deposited on the passivation layer 600 and has been processed to form adhesive seals 1004. The adhesive sealing material may be of material such as one of the Cytop® materials (a registered trademark of Asahi Glass Company, available from Bellex International Corp. of Wilmington, Del.), spin-on-glass, epoxy, metal, or other material acting as a bonding agent and providing a hermetic seal.

Finally, the sacrificial layer 202 has been removed from under the heater element 500 to form the heater cavity 106.

Figure 11:
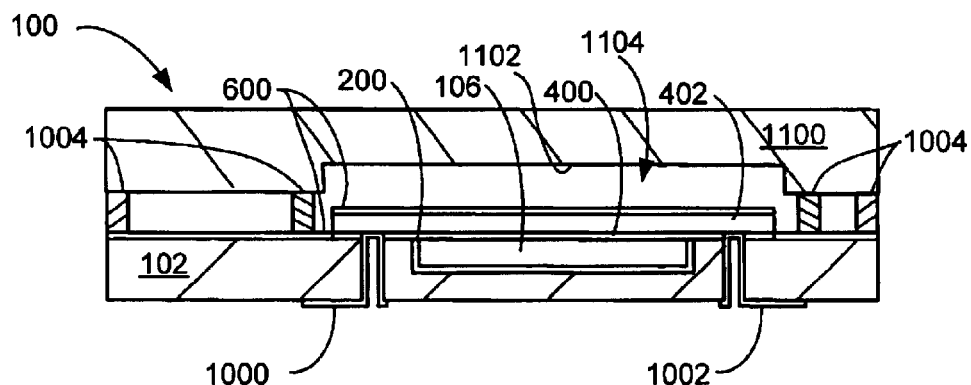
FIG. 11 is the structure of FIG. 10 after placement of a second substrate.

Referring now to FIG. 11, therein is shown the structure of FIG. 10 after placement of a second substrate 1100 on the adhesive seals 1004. The second substrate 1100 may be flat or provided with a recess 1102 to provide additional expansion space for a heated fluid non-conductor 1104.

It will be understood that in other embodiments the electrical connections to the heater layer 402 may be made in a number of different ways including electrical connections between the first and second substrates 102 and 1100 from the sides, and providing via/pads in the second substrate 1100 in the same fashion that the pad/vias 1000 and 1002 are provided in the first substrate 102.

It will also be understood that in other embodiments the adhesive sealing material for forming the adhesive seals 1004 may be deposited on the second substrate 1100 rather than the first substrate 102.

It will further be understood that in other embodiments the adhesive sealing material for forming the adhesive seals 1004 may be deposited on both the first and second substrates 102 and 1100, for example for a bond such as a thermocompression bond using gold.

Figure 12:
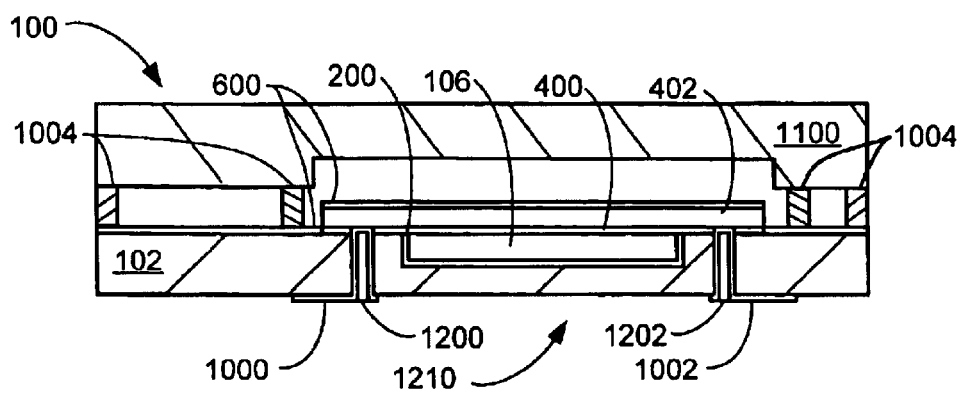
FIG. 12 is the structure of FIG. 11 after the heater unit has been substantially completed.

Referring now to FIG. 12, therein is shown the structure of FIG. 11 in which the liquid metal switch device 100 is substantially completed. The pad/vias 1000 and 1002 have been optionally filled with respective conductive materials 1200 and 1202, such as copper (Cu) or gold (Au) to form a heater unit 1210. As long as electrical contact is made with the heater layer 402, the pad/vias 1000 and 1002 may not need to be completely filled.

Referring now to FIG. 13, therein is shown a simplified plan view of FIG. 10 of the liquid metal switch device 100 according to one embodiment of the present invention. A single throw switch device with two electrodes and a single heater unit is the simplest configuration, but a more complex embodiment of a double throw switch device having three electrodes and two heater units is shown.

The liquid metal switch device 100 includes a main channel 1320, and three electrodes 1322, 1324, and 1326 deposited in spaced relationship along the length of the main channel 1320 in or on the first substrate 102.

Sub-channels 1330 and 1332 are connected to the main channel 1320 between the electrodes 1322 and 1324 and between the electrodes 1324 and 1326, respectively. The sub-channels 1330 and 1332 also respectively connect to chambers 106 and 108 of heater units 1210 and 1212. Different elements of the present invention, such as the channels, chambers, recesses, electrodes, seals, and heater elements, can be on different substrates and still provide an operational device.

The first substrate 102 has the main channel 1320 filled with a liquid metal 1342, such as mercury (Hg), and a fluid non-conductor 1343, such as argon (Ar), nitrogen (N), or air. The second substrate 1100 (FIG. 11) overlays the fist substrate 102, and the liquid metal 1342 and the fluid non-conductor 1343 are sealed in the main channel 1320, the sub-channels 1330 and 1332, and the chambers 106 and 108 by the adhesive seals 1004. The fluid non-conductor 1343 is capable of being expanded by the heater elements 500 and 502 to cause divisions in the liquid metal 1342.

The materials of the first and second substrates 102 and 1100 and of the adhesive seals 1004 are selected to avoid chemical reaction with and wetting by the liquid metal 1342. Chemical reactions may render the liquid metal 1342 incapable of conducting current or may compromise hermeticity of the seals, and wetting may make proper switching movement of the liquid metal 1342 impossible; i.e., an OFF state may not be achievable because the electrical path between the electrodes 1322, 1324, and 1326 cannot be interrupted.

In operation, the sub-channels 1330 and 1332, the chambers 106 and 108, and portions of the main channel 1320 are filled with the fluid non-conductor 1343. The fluid non-conductor 1343 is capable of separating the liquid metal 1342 into discrete portions. The process will either connect the electrodes 1322 and 1324 or the electrodes 1324 and 1326 depending on whether the heater element 502 or the heater element 500 is respectively actuated.

Figure 14:
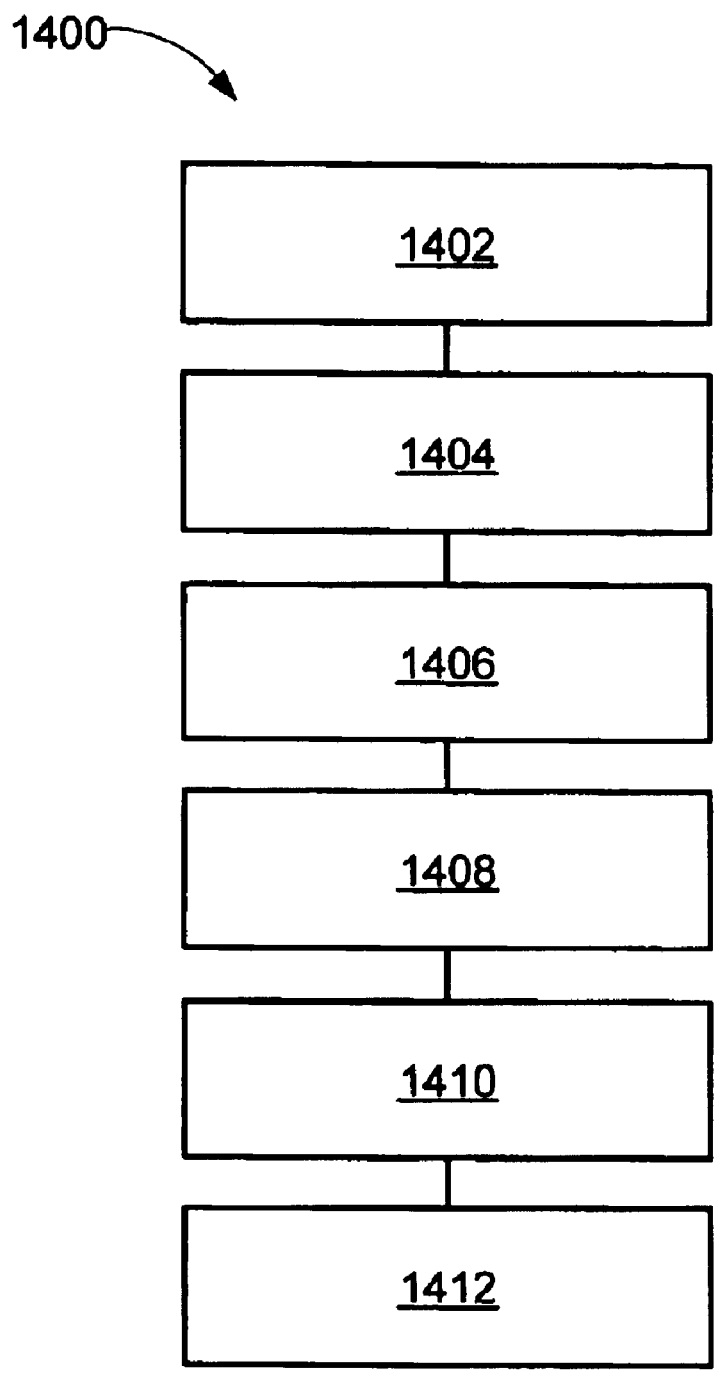
FIG. 14 is a flow chart of a method of manufacture of an embodiment of the present invention.

Referring now to FIG. 14, therein is shown a simplified flow chart of a method 1400 in accordance with the present invention. The method 1400 includes: providing substrates collectively having defined therein a liquid metal switch and a sub-channel connected to the liquid metal switch in a block 1402; forming in a first one of the substrates a cavity filled with sacrificial material and connected to the sub-channel in a block 1404; forming a heater element at least in part over the sacrificial material in a block 1406; forming conductive vias extending through one of the substrates to the heater element in a block 1408; removing the sacrificial material in a block 1410; and joining the substrates with an adhesive seal in a block 1412.

The sequence of the method 1400 is not critical. For example, the forming of the vias in block 1408 may be performed after removing the sacrificial material in block 1410.

While the invention has been described in conjunction with specific embodiments, it is to be understood that many alternatives, modifications, and variations will be apparent in light of the aforegoing description. Accordingly, it is intended to embrace all such alternatives, modifications, and variations that fall within the scope of the included claims. All matters hithertofore set forth or shown in the accompanying drawings are to be interpreted in an illustrative and non-limiting sense.

The invention claimed is:

1. A method for manufacturing a switch device comprising:
    providing substrates collectively having defined therein a liquid metal switch and a sub-channel connected to the liquid metal switch;
    forming in a first one of the substrates a cavity filled with sacrificial material and connected to the sub-channel;
    forming a heater element at least in part over the sacrificial material;
    forming conductive vias extending through one of the substrates to the heater element;
    removing the sacrificial material; and
    joining the substrates with an adhesive seal.

2. The method of claim 1 additionally comprising:
    forming a barrier layer in the cavity and on a surface of the first one of the substrates; and
    removing the barrier layer from the surface of the first one of the substrates.

3. The method of claim 1 wherein:
    forming the cavity comprises depositing sacrificial material over the first one of the substrates; and planarizing the sacrificial material to be co-planar with the surface of the first one of the substrates.

4. The method as claimed in claim 1 wherein forming the heater element comprises:

depositing a seed layer over the sacrificial material;

depositing a heater material layer on the seed layer; and defining the heater element in the seed layer and the heater material layer.

5. The method as claimed in claim 1 additionally comprising:

depositing passivation material prior to forming the heater element.

6. The method as claimed in claim 1 additionally comprising:

depositing passivation material over the heater element.

7. The method as claimed in claim 1 additionally comprising:

planarizing the bottom surface of one of the substrates.

8. A method for manufacturing a switch device comprising:

providing substrates collectively having defined therein a liquid metal switch and a sub-channel connected to the liquid metal switch;

forming in a first one of the substrates a cavity filled with sacrificial material and connected to the sub-channel;

forming a heater element of a refractory nitride at least in part over the filler material;

forming conductive vias extending through one of the substrates to the heater element;

removing the sacrificial material; and joining the substrates with an adhesive seal.

9. The method of claim 8 additionally comprising:

forming a barrier layer comprising silicon nitride, aluminum nitride, titanium nitride, aluminum, nickel chromium, chrome, platinum, gold, titanium, silver, nickel, or a combination thereof in the cavity and on a surface of the first one of the substrates; and removing the barrier layer from the surface of the first one of the substrates.

10. The method of claim 8 wherein:

forming the cavity comprises depositing sacrificial material comprising phospho-silicate glass, aluminum, or a combination thereof over the first one of the substrates; and planarizing the sacrificial material to be co-planar with the surface of the first one of the substrates.

11. The method as claimed in claim 8 wherein forming the heater element comprises:

depositing a seed layer comprising silicon nitride, titanium nitride, aluminum nitride, chrome, nickel chrome, or a combination thereof over the sacrificial material;

depositing a heater material layer on the seed layer; and defining the heater element in the seed layer and the heater material layer.

12. The method as claimed in claim 8 additionally comprising:

depositing passivation material comprising titanium nitride, aluminum nitride, silicon nitride, silicon dioxide, platinum or a combination thereof prior to forming the heater element.

13. The method as claimed in claim 8 additionally comprising:

depositing passivation material comprising titanium nitride, aluminum nitride, silicon nitride, silicon dioxide, platinum or a combination thereof over the heater element.

14. The method as claimed in claim 8 additionally comprising:

planarizing the bottom surface of one of the substrates to be parallel to the top surface thereof.

15. A switch device comprising:

substrates collectively having defined therein a liquid metal switch, a cavity and a sub-channel extending between the cavity and the liquid metal switch;

a heater element spaced from the substrates in the cavity, the heater element comprising a refractory nitride, tungsten silicon nitride, tantalum nitride, platinum, or a combination thereof;

conductive vias electrically connected to the heater element; and an adhesive seal joining the substrates.

16. The device as claimed in claim 15 additionally comprising:

a barrier layer comprising silicon nitride, aluminum nitride, titanium nitride, aluminum, nickel chromium, chrome, platinum, silver, gold, nickel, titanium, or a combination thereof in the cavity.

17. The device as claimed in claim 15 wherein:

the heater element comprises:

a seed layer comprising silicon nitride, titanium nitride, aluminum nitride, chrome, nickel chrome, or a combination thereof; and heater material layer on the seed layer; and the heater element is defined in the seed layer and the heater material layer.

18. The device as claimed in claim 15 additionally comprising:

passivation material comprising titanium nitride, aluminum nitride, silicon nitride, silicon dioxide, platinum or a combination thereof between the heater element and one of the substrates.

19. The device as claimed in claim 15 additionally comprising:

passivation material comprising titanium nitride, aluminum nitride, silicon nitride, silicon dioxide, platinum or a combination thereof over the heater element.

20. The device as claimed in claim 15 additionally comprising conductive pads electrically connected to the conductive vias.

* * * * *